United States Patent
Momeni et al.

(10) Patent No.: US 10,998,855 B2
(45) Date of Patent: May 4, 2021

(54) SCALABLE ARRAYS OF RADIATING OSCILLATING UNITS

(71) Applicant: The Regents of the University of California, Oakland, CA (US)

(72) Inventors: Omeed Momeni, Davis, CA (US); Hossein Jalili, Davis, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 16/485,756

(22) PCT Filed: Jan. 29, 2018

(86) PCT No.: PCT/US2018/015689
§ 371 (c)(1),
(2) Date: Aug. 13, 2019

(87) PCT Pub. No.: WO2018/190934
PCT Pub. Date: Oct. 18, 2018

(65) Prior Publication Data
US 2020/0052649 A1 Feb. 13, 2020

Related U.S. Application Data

(60) Provisional application No. 62/485,187, filed on Apr. 13, 2017.

(51) Int. Cl.
*H03B 5/18* (2006.01)
*H03B 9/14* (2006.01)
(Continued)

(52) U.S. Cl.
CPC ......... *H03B 5/1852* (2013.01); *H03B 5/1206* (2013.01)

(58) Field of Classification Search
CPC .......................... H03B 5/1852; H03B 5/1206
(Continued)

(56) References Cited

U.S. PATENT DOCUMENTS

| 2005/0174182 A1 | 8/2005 | Aikawa et al. |
| 2007/0164830 A1 | 7/2007 | Aikawa et al. |

(Continued)

FOREIGN PATENT DOCUMENTS

JP 2013236259 A 11/2013

OTHER PUBLICATIONS

PCT/US2018/015689 International Search Report, Korean Intellectual Property Office, dated Sep. 19, 2018.
(Continued)

*Primary Examiner* — Richard Tan
(74) *Attorney, Agent, or Firm* — Park, Vaughan, Fleming & Dowler LLP

(57) ABSTRACT

Articles including oscillating units and methods for producing the same are disclosed. An example article includes one or more oscillator units, where each oscillator unit comprises: a micro strip transmission line extending from a first end to a second end. A first termination impedance is coupled to the first end and a second termination impedance is coupled to the second end. A first transistor is coupled between the first end and the midpoint; and a second transistor is coupled between the midpoint and the second end. The micro strip transmission line has a midpoint between the first end and the second end; and each oscillator unit generates a standing wave having a predetermined wavelength in the micro strip transmission line.

18 Claims, 8 Drawing Sheets

(51) Int. Cl.
*H01L 23/66* (2006.01)
*H03B 5/12* (2006.01)

(58) Field of Classification Search
USPC .................................................. 331/107 SL
See application file for complete search history.

(56) References Cited

U.S. PATENT DOCUMENTS

| | | | |
|---|---|---|---|
| 2012/0039366 A1* | 2/2012 | Wood | G01S 13/0209 375/219 |
| 2012/0194267 A1* | 8/2012 | Safavi-Naeini | H03F 3/1935 330/54 |
| 2016/0248142 A1* | 8/2016 | Kawasaki | H03B 5/1847 |

OTHER PUBLICATIONS

PCT/US2018/015689 Written Opinion of the International Searching Authority, Korean Intellectual Property Office, dated Sep. 19, 2018.
Jalili et al.; A 0.34-THz varactor-less scalable standing wave radiator array with 5.9% tuning range in 130nm BiCMOS, 2016 IEEE Radio Frequency Integrated Circuits Symposium (RFIC). San Francisco: IEEE May 2016, pp. 182-185.
Jalili et al.; A 318-to-370GHz standing-wave 2D phased array in 0.13 um BiCMOS. 2017 IEEE International Solid-State Circuits Conference (ISSCC). San Francisco, IEEE Feb. 2017, pp. 310-311.

\* cited by examiner

Extend a micro strip transmission line having a midpoint from a first end to a second end Couple a first termination impedance to the first end and a second transmission impedance to the second end Couple a first transistor between the first end and the midpoint and bias the first transistor to generate a first negative resistance Couple a second transistor between the second end and the midpoint and bias the second transistor to generate a second negative resistance Generate a standing wave in the micro strip transmission line Configure the first and second negative resistances to compensate a resistance of the micro strip transmission line and to sustain a standing wave

FIG. 8

SCALABLE ARRAYS OF RADIATING OSCILLATING UNITS

CROSS-REFERENCE TO RELATED APPLICATIONS

The application claims the benefit of U.S. Provisional Patent Application 62/485,187, filed Apr. 13, 2017 and entitled "Standing Wave Architecture for Scalable Wideband Millimeter Wave and Terahertz Radiator Phased Arrays," which is hereby incorporated by reference in its entirety.

GOVERNMENT LICENSE RIGHTS

This invention was made with government support under Grant No. 1454732 awarded by National Science Foundation. The government has certain rights in the invention.

TECHNICAL FIELD

The design generally relates to integrated circuits and more specifically to scalable arrays of radiating oscillating units on an integrated circuit.

BACKGROUND

Independent free running harmonic oscillator units have been implemented for specific applications that do not impose a coherency requirement between multiple oscillator units. Individual oscillators may be coupled together through active or passive coupling circuits to implement coherent radiator arrays.

Technologies for more efficiently coupling and synchronizing a coherent array of oscillator units are desired.

SUMMARY

Systems including oscillating units and methods for producing the same are disclosed.

An example system includes one or more oscillator units. Each oscillator unit comprises: a micro strip transmission line extending from a first end to a second end. A first termination impedance is coupled to the first end and a second termination impedance is coupled to the second end A first transistor coupled between the first end and the midpoint and a second transistor is coupled between the midpoint and the second end. The micro strip transmission line has a midpoint between the first end and the second end. Each oscillator unit generates a standing wave having a predetermined wavelength in the micro strip transmission line.

The system, in some implementations, further comprises: one or more radiating antenna units coupled to the one or more oscillator units. The one or more radiating antenna units generate a radiating power from each oscillator unit.

The one or more radiating antenna units, in some implementations, generate the radiating power at a predetermined frequency. The predetermined frequency is either twice or four times a frequency associated with the predetermined wavelength.

The first transistor, in some implementations, is biased to generate a first negative resistance at the predetermined wavelength. The second transistor is biased to generate a second negative resistance at the predetermined wavelength. The first negative resistance and the second negative resistance compensate a resistance of the micro strip transmission line and sustain the standing wave of the oscillator unit at the predetermined wavelength.

The first negative resistance and the second negative resistance are, in some implementations, narrow band.

A bias of the first and the second transistors is, in some implementations, simultaneously and similarly adjusted to tune the predetermined wavelength in a predetermined range.

Locations of the first and second transistors are, in some implementations, anti-nodes and the midpoint of the micro strip transmission line is a virtual ground.

Two or more oscillator units are, in some implementations, coupled in a 1-dimensional structure to create a 1-dimensional array of oscillator units. The second end of the micro strip transmission line of an oscillator unit is coupled and matched to a first end of the micro strip transmission line of a neighboring oscillating unit. The first termination impedance is used at the first end of the first oscillating unit of the 1-dimensional array. The second termination impedance is used at the second end of the last oscillating unit of the 1-dimensional array. The 1-dimensional array can sustain a standing wave at the predetermined wavelength. The first termination impedance and the second termination impedance may create a complete reflection at two ends of the 1-dimensional array.

A bias of the first and the second transistors in each one of the oscillator units is simultaneously and uniformly adjusted according to a first predefined bias adjustment pattern to tune the predetermined wavelength of the two or more oscillator units in a predetermined range. The first predefined bias adjustment pattern performs equal bias adjustment to each one of the two or more oscillating units and generates a radiating power from the two or more oscillator units at the adjusted wavelength.

A bias of the first and the second transistors in each one of the oscillator units is simultaneously and uniformly adjusted according to a first predefined bias adjustment pattern to tune the predetermined wavelength of the two or more oscillator units in a predetermined range. The bias of the first and the second transistors in each one of the oscillator units are simultaneously adjusted according to a second predefined bias adjustment pattern to induce a different phase shift in each one of the oscillating units and to cause a phase shift in a signal transferred to radiating antenna units to provide a beam steering of the radiated power. The first and second predefined bias adjustment patterns generate a radiating power from the two or more oscillator units at the tuned wavelength and steered at a predetermined direction.

In some implementations, four or more oscillator units are coupled in a 2-dimensional array having a two or more row by two or more column structure. In each row the second end of a micro strip transmission line of an oscillator unit is coupled and matched to a first end of the micro strip transmission line of a neighboring oscillating unit. Also, in each row the first termination impedance is coupled to the first end of a first oscillating unit at a beginning of the row and the second termination impedance is coupled to the second end of a last oscillating unit at an end of the row. Each rows is coupled to a neighboring row to communicate the predetermined wavelength such that the 2-dimensional array can sustain a standing wave at the predetermined wavelength. In some examples, the first termination impedance and the second termination impedance create a complete reflection at two ends of each row.

The one or more oscillator units and the one or more radiating antenna units are, in some implementations, on an integrated chip.

A length of each micro strip transmission line is essentially the predetermined wavelength of the oscillating unit, and wherein the predetermined wavelength corresponds to a frequency of the oscillating unit that can generate the fourth harmonic of the frequency which is above 300 GHz as the radiating power.

A method for producing an oscillator unit, in some implementations, comprises: extending a micro strip transmission line from a first end to a second end. The transmission line having a midpoint between the first end and the second end. The method further comprises: coupling a first termination impedance to the first end; coupling a second termination impedance to the second end; coupling a first transistor between the first end and the midpoint; biasing the first transistor to generate a first negative resistance at a predetermined wavelength; coupling a second transistor between the midpoint and the second end; biasing the second transistor to generate a second negative resistance at a predetermined wavelength; generating a standing wave having a predetermined wavelength in the micro strip transmission line; configuring the first negative resistance and the second negative resistance to compensate a resistance of the micro strip transmission line and to sustain the standing wave of the oscillator unit at the predetermined wavelength.

The method, in some implementations, further comprises: coupling a radiating antenna unit to the oscillator unit. The radiating antenna unit generates a radiating power from the oscillator unit.

The method, in some implementations, further comprises: applying a first bias to the first transistor to generate a first narrow band negative resistance at the predetermined wavelength; and applying a second bias to the second transistor to generate a second narrow band negative resistance at the predetermined wavelength.

The method, in some implementations, further comprises: coupling one or more oscillator units to create an array of oscillator units; and coupling one or more radiating antenna unit to the one or more oscillator unit. The radiating antenna units generate a radiating power from the one or more oscillator units.

The one or more radiating antenna units are, in some implementations generate the radiating power at a predetermined frequency, which is either twice or four times a frequency associated with the predetermined wavelength.

The method, in some implementations, further comprises: simultaneously and uniformly adjusting a bias of the first and the second transistors in each one of the oscillator units to tune the predetermined wavelength of the one or more oscillator units in a predetermined range.

The method, in some implementations, further comprises: simultaneously and uniformly adjusting a bias of the first and the second transistors in each one of the oscillator units according to a first predefined bias adjustment pattern to tune the predetermined wavelength of the one or more oscillator units in a predetermined range; and simultaneously adjusting the bias of the first and the second transistors in each one of the oscillator units according to a second predefined bias adjustment pattern to perform unequal bias adjustment to each one of the one or more oscillating units and to induce a different phase shift in each one of the oscillating units and to cause a phase shift in the radiating antenna units to provide a beam steering of the radiated power.

BRIEF DESCRIPTION OF THE DRAWINGS

FIG. 8 is a flowchart illustrating an example method of fabricating an oscillating unit, according to some embodiments.

The implementations disclosed herein are illustrated by way of example, and not by way of limitation, in the figures of the accompanying drawings. Like reference numerals refer to corresponding parts throughout the drawings.

DETAILED DESCRIPTION

In emerging applications of millimeter wave and terahertz frequencies such as spectroscopy, imaging, and high data rate communication, sufficient output power and large frequency tune-ability is required to improve sensitivity, resolution, and the high rates. Additionally, fully integrated circuit implementations to perform the above mentioned applications demand sufficient output power and large frequency tune-ability. Moving closer to the terahertz spectrum, integration of radiating antennas on integrated circuit chips to implement antenna array systems may be achieved. As a result, it is desirable to implement oscillating unit arrays that can easily be expanded without requiring extra elements while the arrays can support wide tuning ranges as well as the oscillating units can be coupled to on-chip radiating antenna units to transmit a radiating power in a controllable direction.

Method and system of the disclosure relates to an on-chip array of coherent oscillating units that are coupled to on-chip radiating antenna units. The oscillating units include a micro strip transmission line and one or more transistors coupled to the micro strip transmission line where the micro strip transmission line may have termination impedances at the two ends. The termination impedances can be selected such that a standing wave of a predetermined frequency can be supported in the micro strip transmission line. The one or more transistors may be biased such that they exhibit a negative resistance in the predetermined frequency such that a power generated by the negative resistance is enough to compensate a power loss, e.g., an ohmic power loss, of the micro strip transmission line and the standing wave at the predetermined frequency may be sustained. The on-chip system that include the array of coherent oscillating units coupled to on-chip radiating antenna units can be expanded to provide sufficient radiated power in the c-band between 300 GHz and 350 GHz. A biasing of the transistors of the oscillating units can be adjusted such that the predetermined frequency of micro strip transmission line can be tuned in the above frequency range. Also, a pattern of phase shift can be generated for the tuned predetermined frequency such that the radiating power can be steered.

Figure 1:
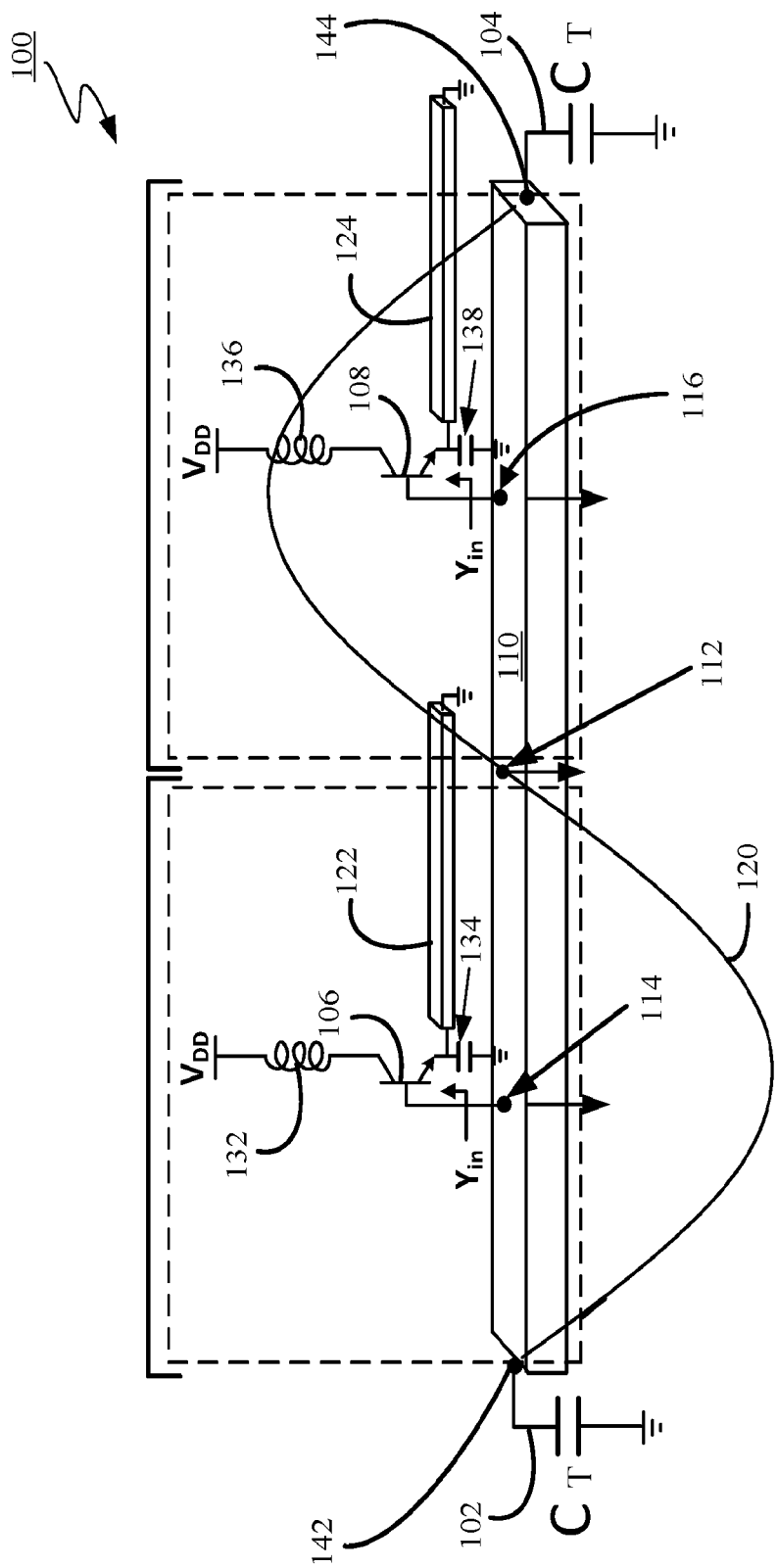
FIG. 1 is a block diagram illustrating an example oscillating unit, according to some embodiments.

FIG. 1 illustrates a diagram of an example oscillating unit according to some embodiments. Oscillating unit 100 includes micro strip transmission line 110 that has two end points 142 and 144 as well as midpoint 112 located between two end points 142 and 144. Oscillating unit 100 also includes two termination impedances 102 and 104 coupled to two end points 142 and 144 of the micro strip transmission line 110. Oscillating unit 100 further includes two transistors 106 and 108 each coupled between midpoint 112 and one of end points 142 and 144 of micro strip transmission line 110. A collector of each one of transistors 106 and 108 are coupled to power supply voltage VDD via inductor 132 or 136; and an emitter of each one of transistors 106 and 108 are coupled to the ground via capacitance 134 or 138. Additionally, a base of transistor 106 may be coupled to location point 114 of micro strip transmission line 110 located between midpoint 112 and end point 142 and a base of the transistor 108 may be coupled to location point 116 of micro strip transmission line 110 located between the midpoint 112 and end point 144. In some examples, location point 116 is at midway between midpoint 112 and end point 144 and location point 114 is at midway between midpoint 112 and end point 142.

In some embodiments, the emitter of each one of transistors 106 and 108 are also coupled to the ground via a micro strip transmission line segment, 124 or 122 where micro strip transmission line segments 124 and 122 are separate from micro strip transmission line 110 and are parallel to micro strip transmission line 110 and are grounded at the ends farther from the emitters of respective transistors 108 and 106. In some examples, as described, a transistor, e.g., transistor 106, is coupled at location point 114 that is essentially midway between first end point 142 and midpoint 112. In some examples, as described, a transistor, e.g., transistor 108, is coupled at location point 116 that is essentially midway between second end point 144 and midpoint 112. In some examples, termination impedances 102 and 104 are large capacitances that may provide a short circuit at first and second end points 142 and 144 and thus midpoint 112 is a virtual ground. In some examples, by providing the short circuits at two end points 142 and 144, micro strip transmission line 110 may support a standing wave of a predetermined frequency and thus a length of micro strip transmission line 110 is a multiple of a predetermined wavelength associated with the predetermined frequency, e.g., one wavelength associated with the predetermined frequency. In some examples, two end points 142 and 144 as well as midpoint 112 are nodes and location points 114 and 116 of the first and second transistors are anti-nodes.

In some embodiments, micro strip transmission line 110 has a length of a single predetermined wavelength lambda associated with the predetermined frequency in the micro strip transmission line. The two termination impedances 102 and 104 have zero impedance, e.g., very high capacitance or very low inductance, to create a complete reflection at two end points 142 and 144 and to create a standing wave with the wavelength lambda in micro strip transmission line 110. In some examples, a length of line segment 124 and 122 is a quarter wavelength, e.g., a quarter of lambda, and thus line segment 124 and 122 coupled to the emitters of transistor 106 and 108 are essentially open circuits.

Figure 5A:
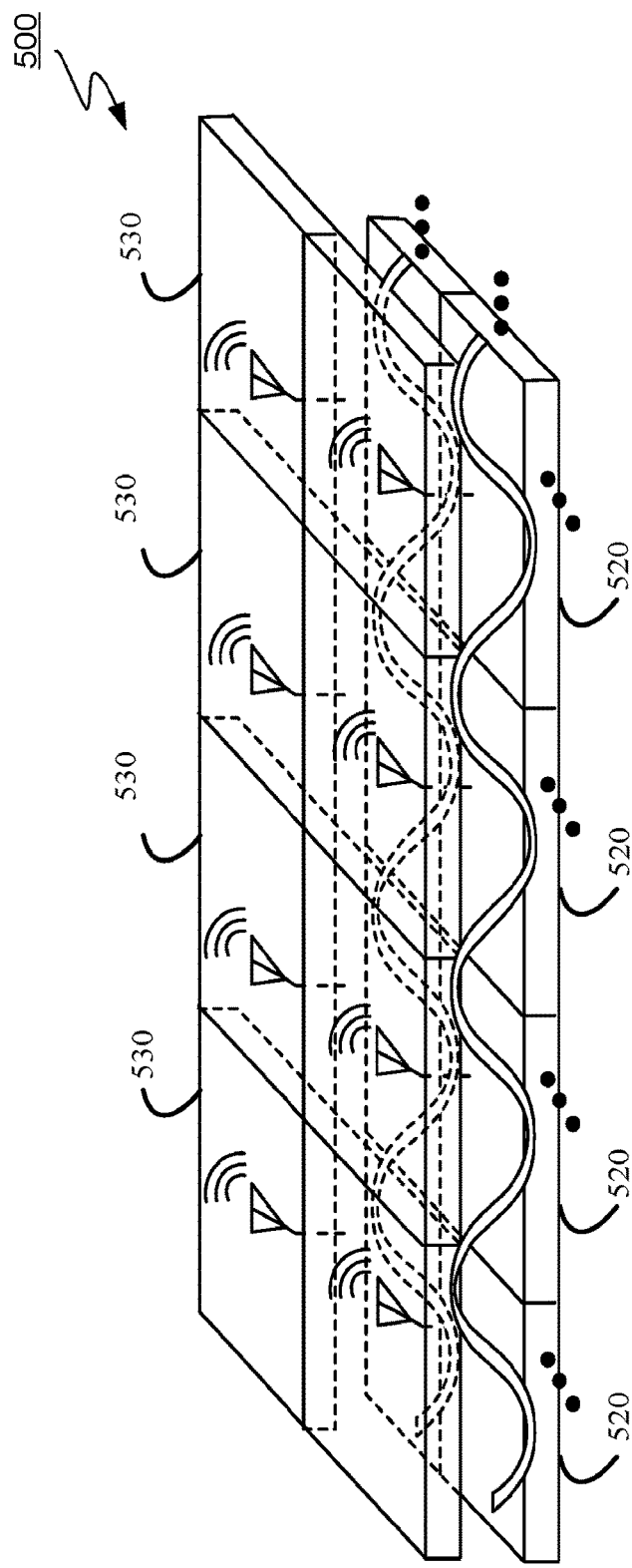
FIG. 5A is a block diagram illustrating an example four by two array structure of oscillating units coupled to radiating antenna units, according to some embodiments.

In some embodiments, oscillating unit 100 is a scalable architecture for radiator arrays in millimeter wave and terahertz spectrum based on standing wave properties. This structure can be easily expanded as shown in FIG. 5A by replicating the radiating unit cell without adding lossy and parasitic elements to the circuit.

Figure 2:
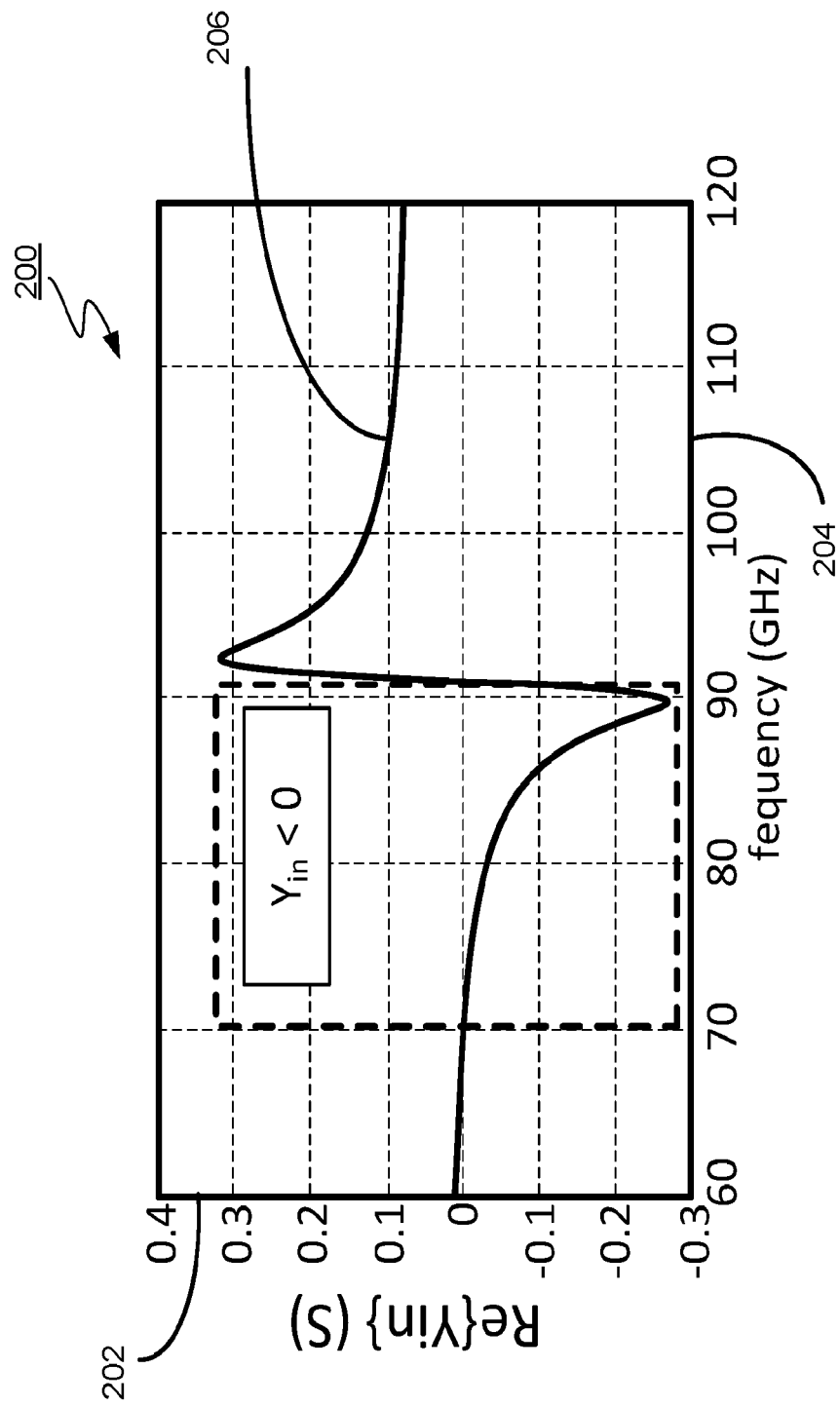
FIG. 2 is a graph illustrating an admittance of an example transistor of the oscillating unit, according to some embodiments.

FIG. 2 illustrates a graph of an admittance of an example transistor of the oscillating unit, in some embodiments. Graph 200 shows a real part of the admittance of one of transistors 106 or 108 of FIG. 1, Horizontal line 204 shows the frequency in GHz and the vertical line 202 shows the real part of the admittance. As shown in graph 200 the admittance and similarly the resistance of transistors 106 or 108 as viewed from the base of the transistor is a negative value in the range of 70 GHz to 90 GHz. In some embodiments, a negative impedance (a negative resistance) is required to generate power to compensate a power loss in micro strip transmission line 110 and to sustain a standing wave. Therefore, the standing wave may be sustained in micro strip transmission line 110 at frequencies in the range of 70 GHz to 90 GHz. In some examples, transistors 106 or 108 are coupled between micro strip transmission line 110 and the radiating antenna units and transistors 106 and 108 may generate one of a second or fourth harmonic, e.g., a fourth harmonic, of the standing wave of micro strip transmission line 110 to generate a radiating power at fourth harmonic frequency of the standing wave by the radiating antenna units coupled to the oscillating units. Thus, the radiating antenna units may transmit the radiating power in the range of 280 GHz and 360 GHz. In some examples, the negative conductance and thus the negative resistance is limited in a narrow band of frequencies around a frequency of operation to prevent oscillations in harmonic frequencies of the frequency of operation or to prevent oscillation in a fraction of the frequency of operation.

Figure 3A:
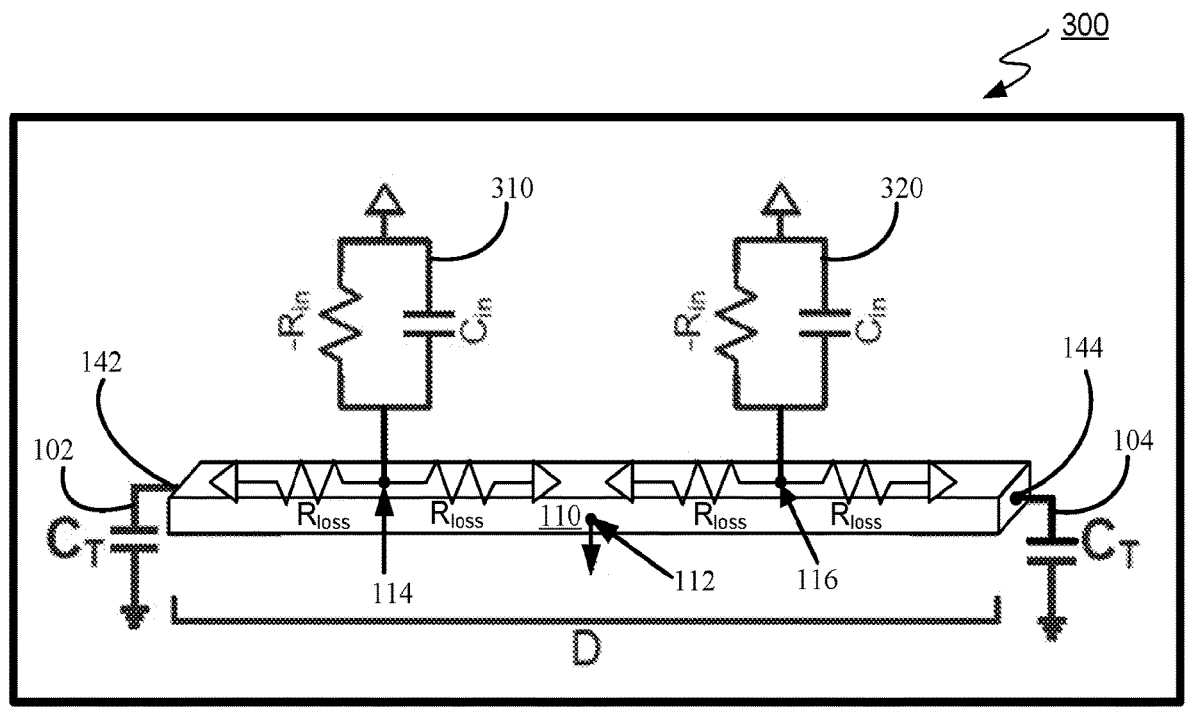
FIG. 3A is a circuit diagram illustrating an example oscillating unit, according to some embodiments.

FIG. 3A illustrates a circuit diagram of an example oscillating unit 300, in some embodiments. Oscillating unit 300 includes micro strip transmission line 110 with length D, midpoint 112, and two termination impedances 102 and 104, e.g., capacitances CT, coupled to two end points 142 and 144. Oscillating unit 300 includes simplified equivalent circuits 310 and 320 of transistors 106 and 108 looking from the base of the transistors at the predetermined frequency as shown in FIG. 1 which each include a capacitance Cin and a negative resistance–Rin. Oscillating unit 300 also includes a resistance Rloss for each segment, a fourth of length D of micro strip transmission line 110. In some examples, length D is the predetermined wavelength lambda of the standing wave and each segment has a length of a quarter wavelength D/4. In some examples, the negative resistance of the transistors at the predetermined frequency can compensate the Rloss of micro strip transmission line 110 and thus a standing wave having wavelength D may be sustained.

Figure 3B:
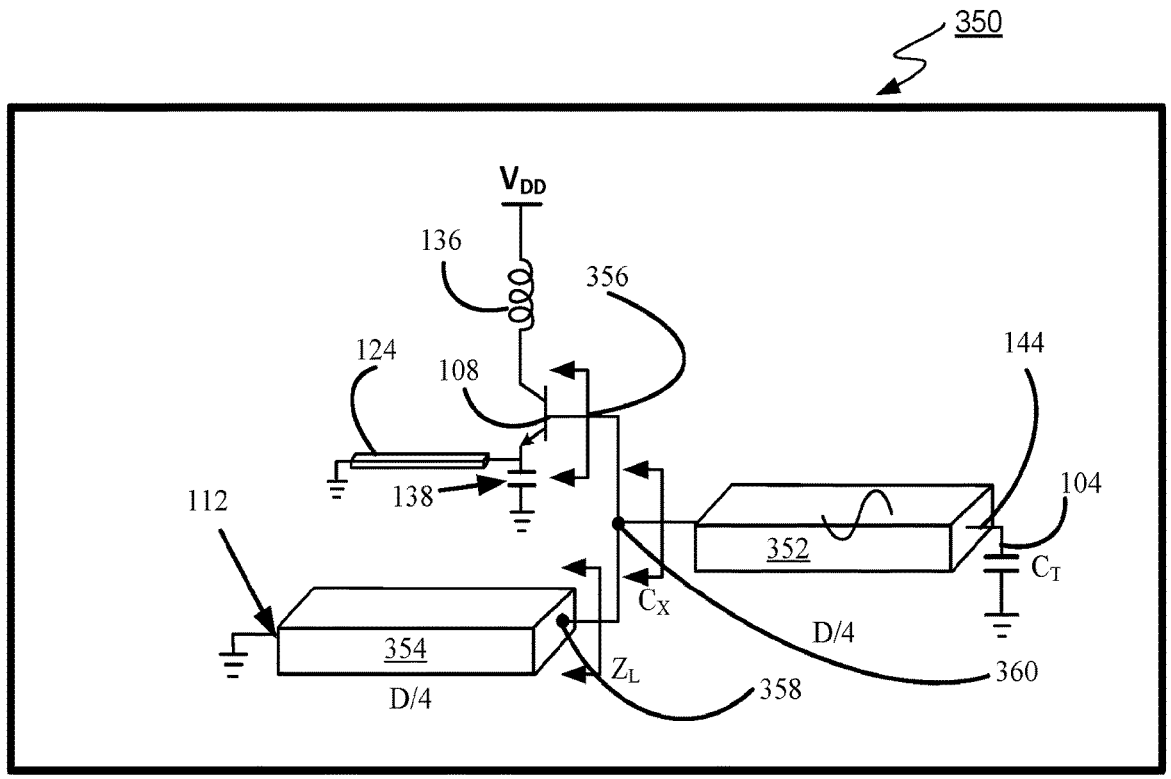
FIG. 3B is a diagram illustrating an example oscillating unit, according to some embodiments.

FIG. 3B illustrates a diagram of an example oscillating unit, in some embodiments. Oscillating unit 350 is a right half portion of oscillating unit 100 of FIG. 1 that includes two micro strip transmission line segments 352 and 354 that are together consistent with a right half segment of micro strip transmission lines 110 of FIG. 1. Micro strip transmission line segments 352 and 354 each have a length of a quarter of the predetermined wavelength or have length D/4. Oscillating unit 350 includes second end point 144 as shown in FIG. 1 that is coupled to termination impedance 104, e.g., capacitor CT. Oscillating unit 350 also shows midpoint 112 of micro strip transmission line HO. Node 360 is consistent with node 116 of FIG. 1 that is coupled to transistor 108 and is located between midpoint 112 and second end point 144.

As described, in some embodiments, the termination impedances are large capacitances CT that make first end point 142 and second end point 144 essentially short circuited that make them essentially complete reflection points and thus midpoint 112 becomes a virtual ground. Thus, in some embodiments the left and right portions of circuit 100 of FIG. 1 at the two sides of midpoint 112 may be considered independently. In some embodiments, segments 354 and 352 of micro strip transmission line 110 shown in FIG. 3B have a length of D/4 and thus are a quarter wavelength of the standing wave of micro strip transmission line 110. Looking into node 358 to the left, the impedance of the quarter wavelength lambda 354 of FIG. 3B essentially becomes equivalent to an open circuit. Looking into the base of the transistor at node 356, a reactive impedance of the capacitance Cin of the equivalent circuit of the transistor 108 may be observed. Thus, looking from node 360 to the left capacitance Cx which is capacitance Cin in parallel with an essentially open circuit may be observed and thus Cx is essentially capacitance Cin. Thus, looking from node 360 to the left the observed reactive impedance is essentially capacitance Cx. Additionally, looking from node 360 to the right of a reactive impedance which is inductance L and capacitance C per unit length of micro strip transmission line 110 as well as termination impedance 104 which is capacitance CT may be observed. In some embodiments, midpoint 112 being a virtual ground and the right and left half of micro strip transmission line 110 being similar, the oscillation may be sustained at frequencies that the total phase shift in a round trip path in FIG. 3B is a multiple of 2 time π. Thus, in some examples, the oscillation radial frequency ω associated with the predetermined frequency in FIG. 3B may be obtained from equation (1) shown below such that when the following phase P is equal to a multiple of π a standing wave may be sustained. In equation (1), $Z_0$ is a characteristic impedance of micro strip transmission line 110 and L and C are the inductance and capacitance per length of micro strip transmission line 110:

$$P = -\omega\sqrt{LC}\left(\frac{D}{4}\right) + \tan^{-1}\left(\frac{1}{\omega Z_0 C_T}\right) + \tan^{-1}\left(\frac{1}{\omega Z_0 C_x}\right) = k\pi \quad (1)$$

As shown in equation (1), in some examples, the phase P depends on Cx and thus the phase changes by changing a bias of transistor 108 and which changes capacitance Cin and consequently changes capacitance Cx. Thus a frequency at which the oscillation may be sustained can change by changing a bias of transistor 108. Alternatively and similarly, by changing a bias of transistor 106, the frequency at which the oscillation may be sustained can change. Thus, in some embodiments, by modifying a bias of transistor 108 and as well the bias of transistor 106 the frequency of the oscillation of the standing wave changes.

Figure 4A:
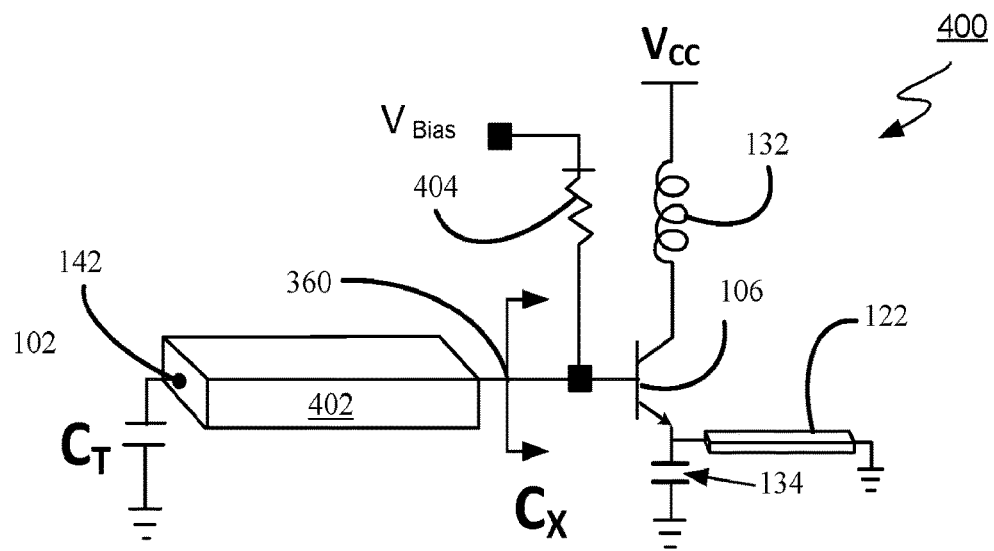
FIG. 4A is a diagram illustrating an example oscillating unit, according to some embodiments.

FIG. 4A illustrates a diagram of an example oscillating unit, in some embodiments. Oscillating unit 400 of FIG. 4A is consistent with a left half portion of oscillation unit 100 of FIG. 1. Additionally, FIG. 4A shows a circuit, e.g., variable resistor 404, for adjusting a bias of transistor 106. As discussed above, a frequency of oscillation of the standing wave in oscillating unit 400 depends on the input capacitance, observed from base, of transistor 106. In some examples, by modifying variable resistor 404 and thus by modifying a bias point of transistor 106, the input capacitance of transistor 106 may change, adjusting a frequency of oscillation of the standing wave in micro strip transmission line 402 that is consistent with a portion of micro strip transmission line 110 as shown in FIG. 1.

Figure 4B:
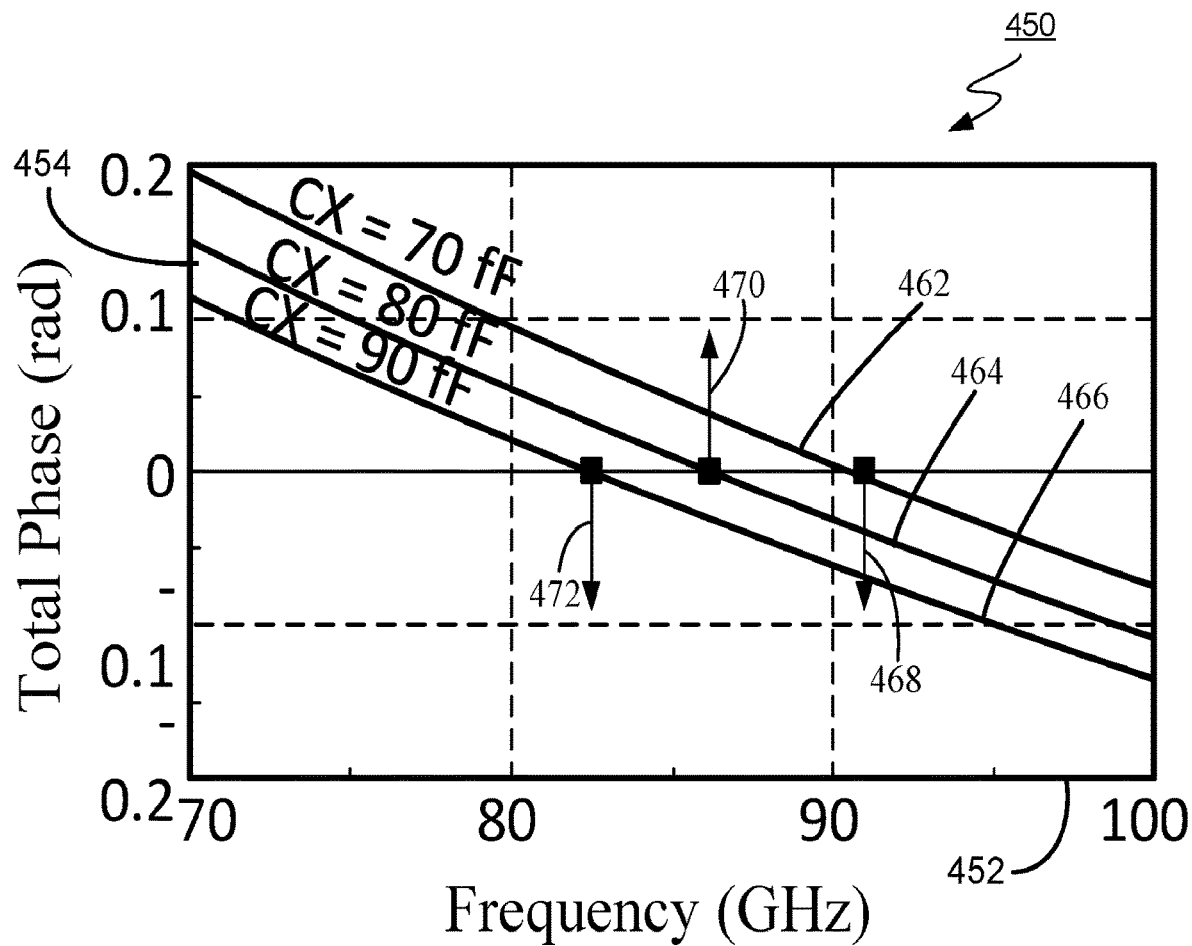
FIG. 4B is a graph illustrating example phase shifts, according to some embodiments.

FIG. 4B illustrates example graphs of phase shifts, in some embodiments. In some embodiments, phase shift 454 is determined according to equation (1) above. In graph 450, phase shift 454 associated with oscillating unit 100 of FIG. 1 according to equation (1) versus frequency 452 of operation f0 in GHz is shown. Graph 450 shows three curves of phase shifts 462, 464, and 466 corresponding to three input capacitances Cx at the base of transistor 106 shown in FIG. 4A that are respectively equal to 70 fF, 80 fF, and 90 fF. As shown, the three curves 462, 464, and 466 may correspond to three different biases applied to transistor 106. In each curve, the oscillation is sustained at a different frequency where the phase shift for that frequency is zero, a zero multiple of π. As shown, for curve 462 corresponding to Cx=70 fF, the oscillation is sustained at point 468 that corresponds to frequency f0=90.7 GHz of the oscillating unit. Also, for curves 464 and 466 that respectively correspond to Cx=80 fF and 90 GHz, the oscillation is sustained at points 470 and 472 that correspond to frequencies f0=86.2 GHz and 82.5 GHz of the oscillating unit. In some embodiments, one of a second or a fourth harmonic of the standing wave is generated by transistor 106, transistor 108, or both and one of the second or fourth harmonic is radiated by the on chip radiating antenna units as the radiated power.

In some examples, a tradeoff controls the oscillation amplitude at the base of transistor 106 and 108. A transistor may be biased at a higher base-emitter voltage that may provide stronger loss compensation for the oscillator unit and increases the amplitudes of the travelling waves. However, the phase difference between these waves at the base terminal increases. On the other hand, as the base-emitter voltage drops, the amplitudes of the travelling waves and their phase difference drop at the same time. Therefore, in some examples, the tradeoff provides a wider range of frequency tuning while keeping the same tuned frequency in each oscillating unit and keeping the transmitted radiating power within a predefined range as described with respect to FIG. 6.

In some examples and regarding harmonic generation in transistors 106 and 108, a transistor bias may be decreased so that the oscillation frequency may be increased, the fundamental signal amplitude goes up but the transistor harmonic generation goes down. These two phenomena may affect the output power in opposite directions.

FIG. 5A illustrates a four by two example array structure of oscillating units coupled to radiating antenna units, in some embodiments. Array structure 500 shows a 4 by 2 array of oscillating units 520 where each oscillating unit 520 is consistent with oscillating unit 100 of FIG. 1 and thus the oscillating units can sustain a standing wave at a predetermined frequency Each oscillating units 520 is coupled to radiating antenna unit 530 such that radiating antenna unit 530 can radiate a power. In some examples, radiating antenna units 530 radiate a power in a frequency that is a second or fourth harmonic of the standing wave of oscillation units 520. In some examples, by adjusting the bias of the transistors of oscillating units 520, a frequency of the standing wave and consequently a frequency of the radiated power can be tuned. As described, in the four by two array structure, the oscillating units in each row as well as the oscillating units of different row are couple to each other and to the first and second termination impedances such that each one of the oscillator units of the four by two array generates a standing wave at a same wavelength.

Figure 5B:
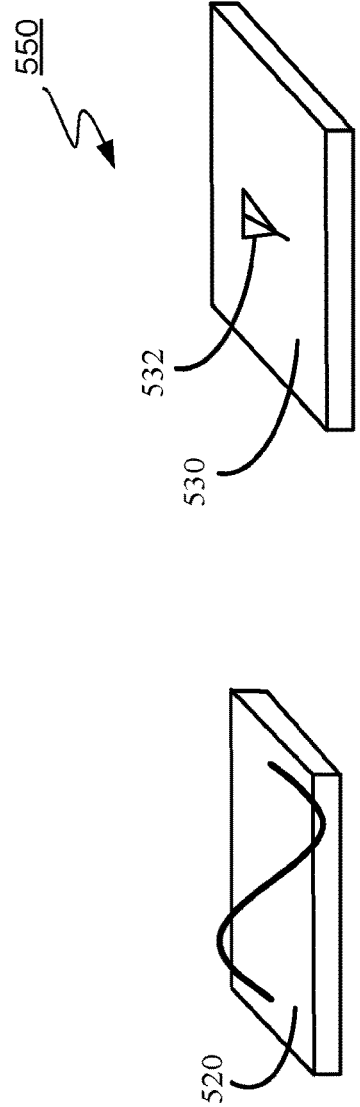
FIG. 5B is a block diagram illustrating an example oscillating unit and an example radiating antenna unit, according to some embodiments.

FIG. 5B illustrates an example oscillating unit and an example radiating antenna unit, in some embodiments. Diagram 550 shows a single oscillating unit 520 consistent with oscillating unit 100 of FIG. 1 as well as a single radiating antenna unit 530. The radiating antenna unit 530 includes antenna 532 that can generate a radiated power at a harmonic frequency of the frequency of the standing wave of oscillating unit 520 that is coupled radiating antenna unit 530.

In some embodiments, on chip radiating antenna units 530 are used to radiate the extracted fourth harmonic power from oscillating units 520 due to their single feed architecture shown in FIG. 5 where they may have good efficiency and directivity. In some examples, the radiation is only front side radiation and therefore post processing of the substrate or having to use a silicon lens may be avoided.

Figure 6:
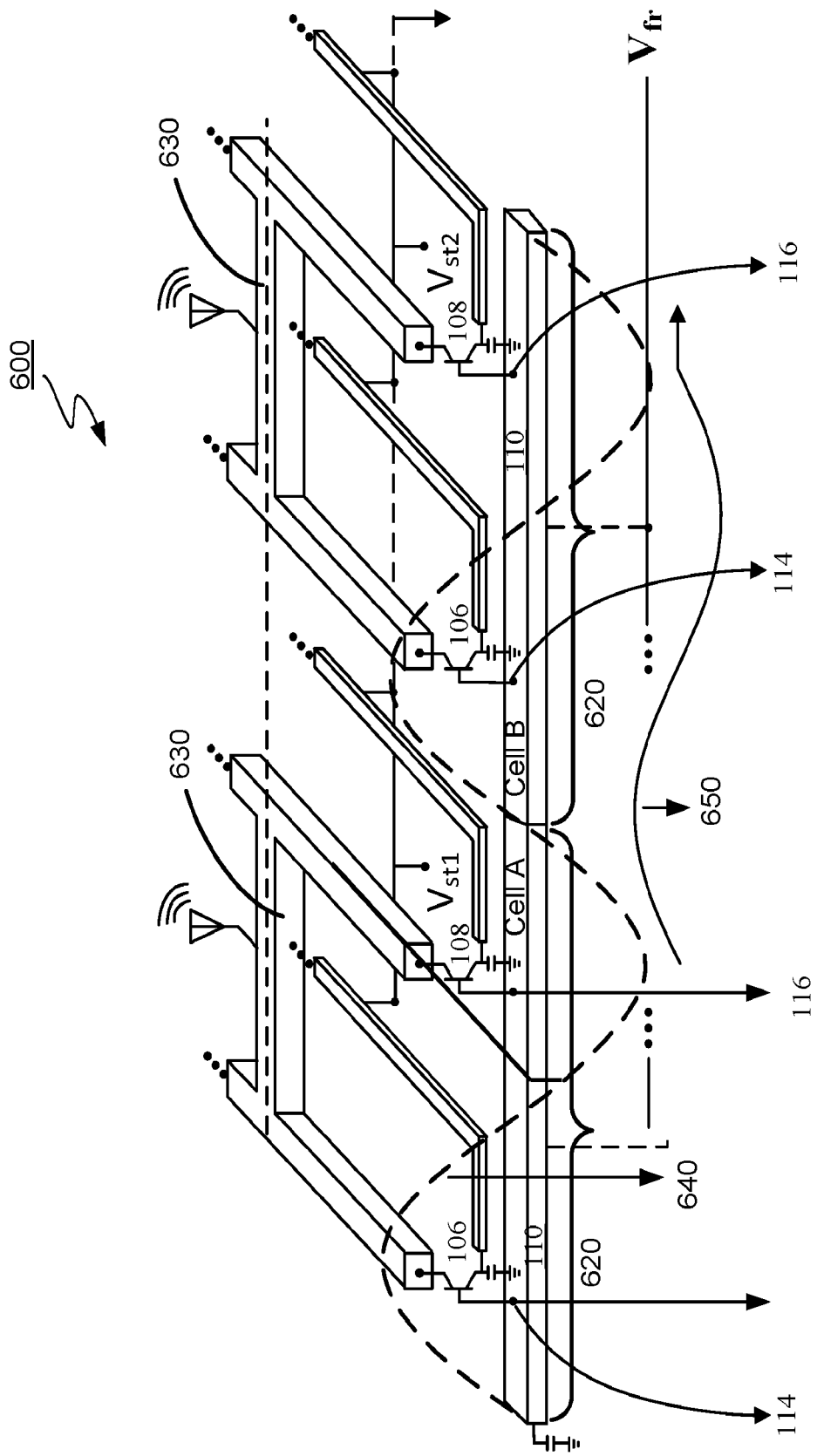
FIG. 6 is a block diagram illustrating an example two by one array system of oscillating units coupled to radiating antenna units, according to some embodiments.

FIG. 6 illustrates a two by one example array system of oscillating units coupled to radiating antenna units, in some embodiments. Array system 600 includes two oscillating units 620, also referred to as Cell A and Cell B in FIG. 6, which are consistent with the oscillating units 520 of FIG. 5. Each oscillating unit 620 has two transistors 106 and 108 where each oscillating unit 620 is coupled to via transistors 106 and 108 to radiating antenna units 630 that are consistent with the radiating antenna units 530 of FIG. 5. In some embodiments, in each oscillating units 620 there is a standing wave SW and a travelling wave TW.

In some embodiments, as shown in FIG. 6, in addition to standing wave 640, traveling wave 650 of a same frequency is also formed to transfer the excess power from one oscillating unit 620 to a neighboring oscillating unit 620. Thus, the addition of the travelling wave to the existing standing way may result in phase shifts between the base voltages of the transistors and consequently the radiated signals fourth harmonics. The base voltages of transistors 106 and 108 of each oscillating unit 620 may be used as control inputs to perform both frequency tuning and beam steering, respectively. In some examples, the base voltages are uniformly adjusted on all transistors 106 and 108 of each one of oscillating units 620 at the same time to tune the frequency in each oscillating unit to a same adjusted frequency. However, the base voltage of transistors 106 and 108 of each oscillating unit 620 may independently be changed to create a phase shift for steering the beam. In some examples, by controlling the base voltages of transistors 106 and 108 of oscillating units 620, the beam radiation pattern can be steered in a 120 degrees angle. In some examples, by controlling the base voltages of transistors 106 and 108 of oscillating units 620, an up to 15% tune-ability of the frequency of the transmitted radiating power with less than 6 dB variation across the tuning range can be achieved.

In some embodiments as shown in array system 600, by changing voltage Vbe applied between the base and the emitter of transistors 106 and 108 of each oscillating unit 620, an operating frequency f0 of the oscillating units may change according to equation (1). In some examples, Vfr, Vst1, and Vst2 are used as control inputs to perform frequency tuning and beam steering, respectively. Changing Vfr changes Vbe of each one transistors 106 and 108 at the same time to perform frequency tuning of each one of the oscillating units of array system 600, whereas changing Vst1 or Vst2 can be used to change Vbe of each one of oscillating units 620 independently to create a different phase shift according to a predefined pattern for each oscillating unit that consequently may be transferred to radiating antenna units 630 to be used to perform beam steering.

Figure 7:
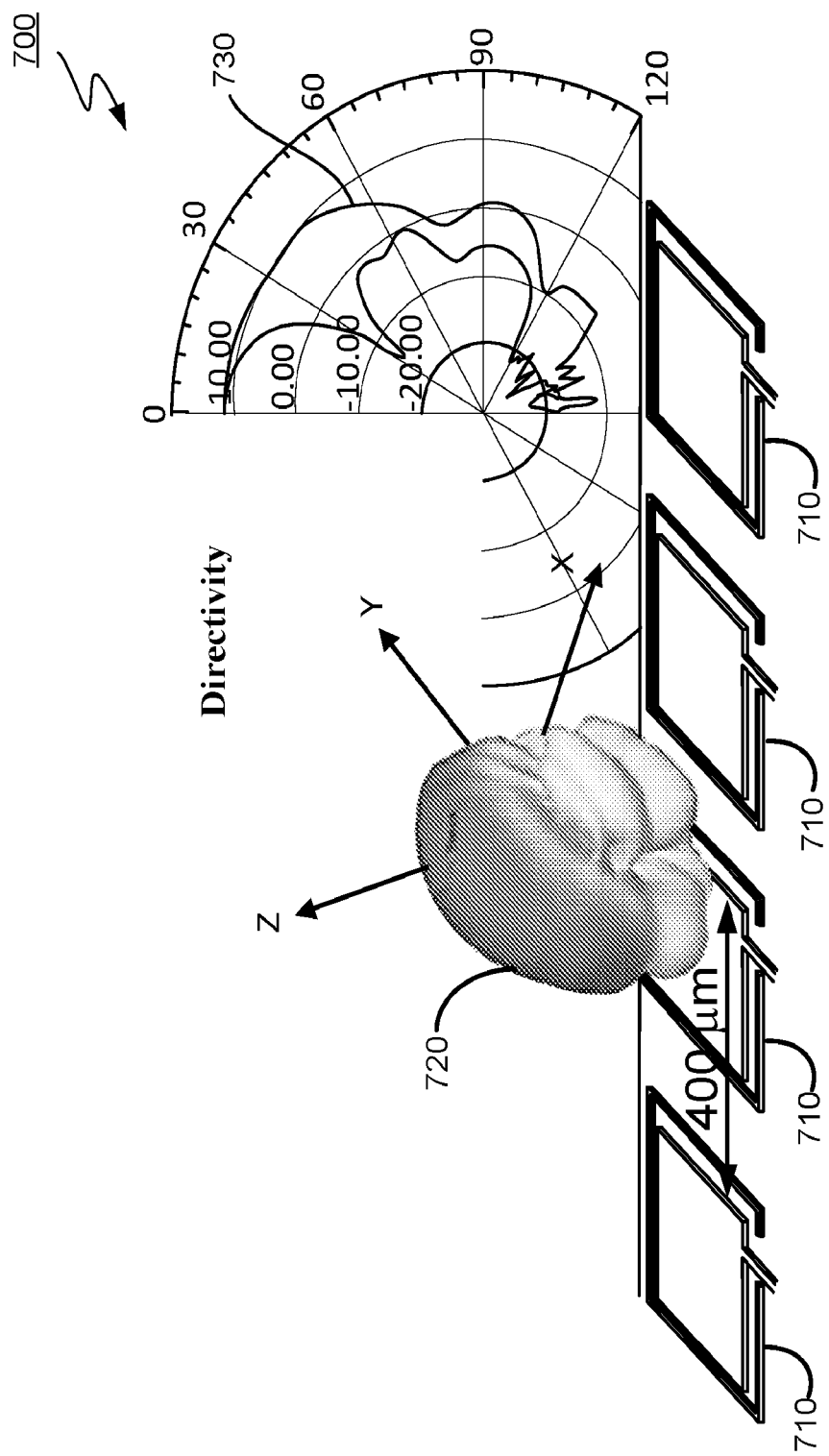
FIG. 7 is a block diagram illustrating an example radiation pattern of an array system of oscillating units coupled to radiating antenna units, according to some embodiments.

FIG. 7 illustrates a radiation pattern of an example array system of oscillating units coupled to radiating antenna units, in some embodiments. System 700 shows a 3D radiation pattern 720 of a system that includes a number of units 710 that each include oscillating unit 520 and radiating antenna unit 530 as shown in FIG. 5B. System 700 also shows antenna pattern 730 that displays a directivity of a radiation pattern of the system. In some embodiments, an oscillating frequency of each oscillating unit has a phase shift relative to the other oscillating units to generate a predetermined directivity for the radiation pattern as discussed above.

In some embodiments, a bias of the first and the second transistors in each one of the oscillator units are simultaneously and uniformly adjusted according to a first predefined bias adjustment pattern to tune the predetermined wavelength of the two or more oscillator units in a predetermined range. The first predefined bias adjustment pattern may perform equal bias adjustment to each one of the two or more oscillating units and thus the first predefined bias adjustment pattern may generate a radiating power from the two or more oscillator units at a same adjusted wavelength.

In some embodiments, a bias of the first and the second transistors in each one of the oscillator units are simultaneously and uniformly be adjusted according to a first predefined bias adjustment pattern to tune the predetermined wavelength of the two or more oscillator units in a predetermined range. Concurrently with applying the first predefined bias adjustment pattern, the bias of the first and the second transistors in each one of the oscillator units are simultaneously adjusted according to a second predefined bias adjustment pattern to induce a different phase shift in each one of the oscillating units and to cause a phase shift in a signal transferred to radiating antenna units to provide a beam steering of the radiated power. The first and second predefined bias adjustment patterns are configured to generate a radiating power from the two or more oscillator units at a tuned wavelength and steered at a predetermined direction.

The second predefined bias adjustment pattern may perform unequal bias adjustment to each one of the two or more oscillating units and to induce a different phase shift in each one of the oscillating units and to cause a phase shift in signal transferred to the radiating antenna units to provide a beam steering of the radiated power. The second predefined bias adjustment pattern may generate a radiating power from the two or more oscillator units at the adjusted wavelength and steered a predetermined direction.

In some examples and returning back to FIG. 1, a length of each micro strip transmission line 110 is essentially a predetermined wavelength that corresponds to a frequency of above 75 GHz that can generate the fourth harmonic which is above 300 GHz for the radiating power.

FIG. 8 illustrates a flow graph of an example method of fabricating an oscillating unit, in some embodiments. Notably, one or more steps of method 800 described herein may be omitted, performed in a different sequence, and/or combined with other methods for various types of applications contemplated herein. The method 800 can be performed for creating an oscillating unit of FIG. 1. Also, as shown in FIG. 5, an array of oscillator units may be created.

As shown in FIG. 8, at step 802, a micro strip transmission line having a midpoint is extended from a first end point to a second end point. In some examples micro strip transmission line 110 of FIG. 1 is created on an integrated circuit.

The micro strip transmission line is extended between first end point 142 and second end point 144 and has midpoint 112.

At step 804, a first termination impedance is coupled to the first end point and a second transmission impedance is coupled to the second end point. The termination impedance may create a short circuit, an open circuit, or any other impedance at first and second end points 142 and 144. In some examples, the first and second end points are attached to large capacitances and a short circuit is essentially created at the first and second end points and thus midpoint 112 is a virtual ground.

At step 806, a first transistor is coupled between the first end point and the midpoint. The first transistor is biased to generate a first negative resistance. In some examples first transistor 106 is coupled at midway 114 between first end point 142 the midpoint 112. In some examples as shown in FIGS. 1 and 3A, the micro strip transmission line has a length of D and first transistor 106 is coupled at D/4 distance from either of midpoint 112 or first end point 142. First transistor 106 may be biased as shown in FIGS. 1 and 4A such that as shown in FIG. 2 the first transistor shows a negative admittance, and thus negative resistance, at a frequency of operation of the oscillation unit.

At step 808, a second transistor is coupled between the second end point and the midpoint. Second transistor 108 is biased to generate a second negative resistance. In some examples second transistor 108 is coupled at a midway between second end point 144 midpoint 112. In some examples the micro strip transmission line as shown in FIGS. 1 and 3A has a length of D and second transistor 108 is coupled at D/4 distance from either of midpoint 112 or second end point 144. Second transistor 108 may be biased as shown in FIGS. 1 and 3A such that as shown in FIG. 2 the second transistor shows a negative admittance, and thus negative resistance, at a frequency of operation of the oscillation unit.

At step 810, a standing wave is generated in the micro strip transmission line. In some embodiments, the terminal impedance of the first and second end point is configured such that a standing wave can be created in micro strip transmission line 110 of FIG. 1. In some examples, the micro strip transmission line exhibits a resistance and thus an energy loss, however, the first transistor the second transistor, or both are biased such that they show a negative resistance and thus generate power in the operating frequency of the standing wave.

At step 812, the first and second negative resistances are configured to compensate a resistance of the micro strip transmission line and to sustain a standing wave. By adjusting the bias of the first and second transistors, the transistors can exhibit a required negative resistance and thus enough power to compensate the power loss of micro strip transmission line 110 to create a sustaining standing wave.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components.

These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first termination impedance could be termed a second termination impedance, and, similarly, a second termination impedance could be termed a first termination impedance, without changing the meaning of the description, so long as all occurrences of the "first termination impedance" are renamed consistently and all occurrences of the "second termination impedance" are renamed consistently. The first termination impedance and the second termination impedance are both termination impedances, but they are not the same termination impedance.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. A system comprising:
one or more oscillator units, each oscillator unit comprising:
a micro strip transmission line extending from a first end to a second end, wherein the micro strip transmission line has a midpoint between the first end and the second end;
a first transistor coupled between the first end and the midpoint; and
a second transistor coupled between the midpoint and the second end;
a first termination impedance coupled to the first end of at least one of the one or more oscillator units;
a second termination impedance coupled to the second end of at least one of the one or more oscillator units; and
one or more radiating antenna units coupled to the one or more oscillator units, wherein the one or more radiating antenna units are configured to generate a radiating power from the one or more oscillator units;
wherein:
each oscillator unit is configured to generate a standing wave having a predetermined wavelength in the micro strip transmission line;
a bias of the first and the second transistors in each oscillator unit is uniformly adjusted according to a first predefined bias adjustment pattern to tune the predetermined wavelength in a predetermined range; and
the bias of the first and the second transistors in each oscillator unit is further adjusted according to a second predefined bias adjustment pattern to perform unequal bias adjustment to each of the one or more oscillating units and to induce a different phase shift in each of the oscillating units and to cause a phase shift in the radiating antenna units to provide a beam steering of the radiated power.

2. The system of claim 1, wherein:
the one or more radiating antenna units are configured to generate the radiating power at a predetermined frequency, and
the predetermined frequency is either twice or four times a frequency associated with the predetermined wavelength.

3. The system of claim 1, wherein the one or more oscillator units and the one or more radiating antenna units are on an integrated chip.

4. The system of claim 1, wherein:
the first transistor is configured to be biased to generate a first negative resistance at the predetermined wavelength,
the second transistor is configured to be biased to generate a second negative resistance at the predetermined wavelength, and
the first negative resistance and the second negative resistance are configured to compensate a resistance of the micro strip transmission line and to sustain the standing wave of the oscillator unit at the predetermined wavelength.

5. The system of claim 4, wherein the first negative resistance and the second negative resistance are narrow band.

6. The system of claim 1, wherein locations of the first and second transistors are configured to be anti-nodes and the midpoint of the micro strip transmission line is configured to be a virtual ground.

7. The system of claim 1, wherein:
two or more oscillator units are coupled in a 1-dimensional structure to create a 1-dimensional array of oscillator units,
the second end of the micro strip transmission line of an oscillator unit is coupled and matched to the first end of the micro strip transmission line of a neighboring oscillator unit, and
the first termination impedance is coupled to the first end of a first oscillator unit at a beginning of the 1-dimensional array and the second termination impedance is coupled to the second end of a last oscillator unit at an end of the 1-dimensional array.

8. The system of claim 7, wherein:
the first predefined bias adjustment pattern is configured to perform equal bias adjustment to each one of the two or more oscillating units, and
the first predefined bias adjustment pattern is configured to generate a radiating power from the two or more oscillator units at the adjusted wavelength.

9. The system of claim 7, wherein:
the first and second predefined bias adjustment patterns are configured to generate a radiating power from the two or more oscillator units at the tuned wavelength and steered at a predetermined direction.

10. The system of claim 1, wherein:
four or more oscillator units are coupled in a 2-dimensional array having a two or more row by two or more column structure,
in each row the second end of the micro strip transmission line of an oscillator unit is coupled and matched to the first end of the micro strip transmission line of a neighboring oscillating unit,
in each row the first termination impedance is coupled to the first end of a first oscillating unit at a beginning of the row and the second termination impedance is coupled to the second end of a last oscillating unit at an end of the row, and
each row is coupled to a neighboring row to communicate the predetermined wavelength.

11. The system of claim 1, wherein:
a length of each micro strip transmission line is essentially the predetermined wavelength, and
the predetermined wavelength corresponds to a frequency above 300 GHz.

12. A method of creating an oscillator unit, comprising:
extending a micro strip transmission line from a first end to a second end, wherein the transmission line has a midpoint between the first end and the second end;
coupling a first transistor between the first end and the midpoint;
coupling a second transistor between the midpoint and the second end;
generating a standing wave having a predetermined wavelength in the micro strip transmission line;
coupling one or more oscillator units to create an array of oscillator units;
coupling a first termination impedance to the first end of at least one of the one or more oscillator units; and
coupling a second termination impedance to the second end of at least one of the one or more oscillator units;
coupling one or more radiating antenna units to the one or more oscillator units, wherein the radiating antenna units are configured to generate a radiating power from the one or more oscillator units;

uniformly adjusting a bias of the first and the second transistors in each of the one or more oscillator units according to a first predefined bias adjustment pattern to tune the predetermined wavelength in a predetermined range; and adjusting the bias of the first and the second transistors in each of the one or more oscillator units according to a second predefined bias adjustment pattern to perform unequal bias adjustment to each of the one or more oscillating units and to induce a different phase shift in each of the oscillating units and to cause a phase shift in the radiating antenna units to provide a beam steering of the radiated power.

13. The method of claim 12, further comprising:

applying a first bias to the first transistor to generate a first narrow band negative resistance at the predetermined wavelength; and applying a second bias to the second transistor to generate a second narrow band negative resistance at the predetermined wavelength.

14. The method of claim 12, wherein:

the one or more radiating antenna units are configured to generate the radiating power at a predetermined frequency, and the predetermined frequency is either twice or four times a frequency associated with the predetermined wavelength.

15. The method of claim 12, further comprising:

biasing the first transistor to generate a first negative resistance at the predetermined wavelength;

biasing the second transistor to generate a second negative resistance at the predetermined wavelength; and configuring the first negative resistance and the second negative resistance to compensate a resistance of the micro strip transmission line and to sustain the standing wave at the predetermined wavelength.

16. A system, comprising:

multiple oscillator units, each oscillator unit comprising:
  a micro strip transmission line having a first end, a second end, and a midpoint between the first end and the second end;
  a first transistor coupled between the first end and the midpoint; and
  a second transistor coupled between the midpoint and the second end;

a first termination impedance coupled to the first end of at least one of the multiple oscillator units;

a second termination impedance coupled to the second end of at least one of the multiple oscillator units; and one or more radiating antenna units configured to radiate power from the one or more oscillator units;

wherein:
  each oscillator unit is configured to generate a standing wave having a predetermined wavelength in the micro strip transmission line; and
  biases of the first and second transistors in each oscillator unit are adjusted according to a first predefined bias adjustment pattern to tune the predetermined wavelength of the one or more oscillator units in a predetermined range.

17. The system of claim 16, wherein:

the first transistor is biased to generate a first negative resistance at the predetermined wavelength, the second transistor is biased to generate a second negative resistance at the predetermined wavelength, and the first negative resistance and the second negative resistance are configured to compensate a resistance of the micro strip transmission line and to sustain the standing wave of the oscillator unit at the predetermined wavelength.

18. The system of claim 16, wherein:

the biases of the first and the second transistors in each oscillator unit are further adjusted according to a second predefined bias adjustment pattern to perform unequal bias adjustment to the multiple oscillating units and to induce a different phase shift in one or more of the oscillating units, to cause a phase shift in the radiating antenna units to provide beam steering of the radiated power.

* * * * *